(12) United States Patent
Yasusaka

(10) Patent No.: US 9,875,950 B2
(45) Date of Patent: Jan. 23, 2018

(54) SEMICONDUCTOR DEVICE

(71) Applicant: Rohm Co., Ltd., Kyoto (JP)

(72) Inventor: Makoto Yasusaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 91 days.

(21) Appl. No.: 14/636,331

(22) Filed: Mar. 3, 2015

(65) Prior Publication Data

US 2015/0255451 A1    Sep. 10, 2015

(30) Foreign Application Priority Data

Mar. 4, 2014    (JP) ................................. 2014-041434

(51) Int. Cl.
| | | |
|---|---|---|
| *H01L 23/34* | (2006.01) | |
| *H03K 3/011* | (2006.01) | |
| *H01L 27/02* | (2006.01) | |
| *H03K 17/08* | (2006.01) | |
| *H01L 23/367* | (2006.01) | |

(52) U.S. Cl.
CPC .......... *H01L 23/34* (2013.01); *H01L 27/0248* (2013.01); *H03K 3/011* (2013.01); *H01L 23/3677* (2013.01); *H01L 2224/05554* (2013.01); *H01L 2224/48091* (2013.01); *H01L 2224/49113* (2013.01); *H03K 2017/0806* (2013.01)

(58) Field of Classification Search
None
See application file for complete search history.

(56) References Cited

U.S. PATENT DOCUMENTS

| | | | |
|---|---|---|---|
| 2010/0193943 A1* | 8/2010 | Crowder ............... | H01L 23/047 257/737 |
| 2011/0233760 A1* | 9/2011 | Shiga ..................... | H01L 23/34 257/735 |
| 2011/0298528 A1* | 12/2011 | Endo .................. | H03K 17/6871 327/512 |
| 2013/0314964 A1* | 11/2013 | Yoshikawa ............. | H01F 37/00 363/131 |

FOREIGN PATENT DOCUMENTS

JP    2005-278344    10/2005

* cited by examiner

*Primary Examiner* — Tom Thomas
*Assistant Examiner* — Nilufa Rahim
(74) *Attorney, Agent, or Firm* — Fish & Richardson P.C.

(57) ABSTRACT

A semiconductor device includes a heat source and a heat detection element which are formed on a semiconductor substrate; and a heat conductive member formed across both of the heat source and the heat detection element, a thermal conductivity of the heat conductive member being higher than a thermal conductivity of the semiconductor substrate, and wherein the heat source, the heat detection element and the heat conductive member are integrated on the semiconductor substrate.

19 Claims, 11 Drawing Sheets

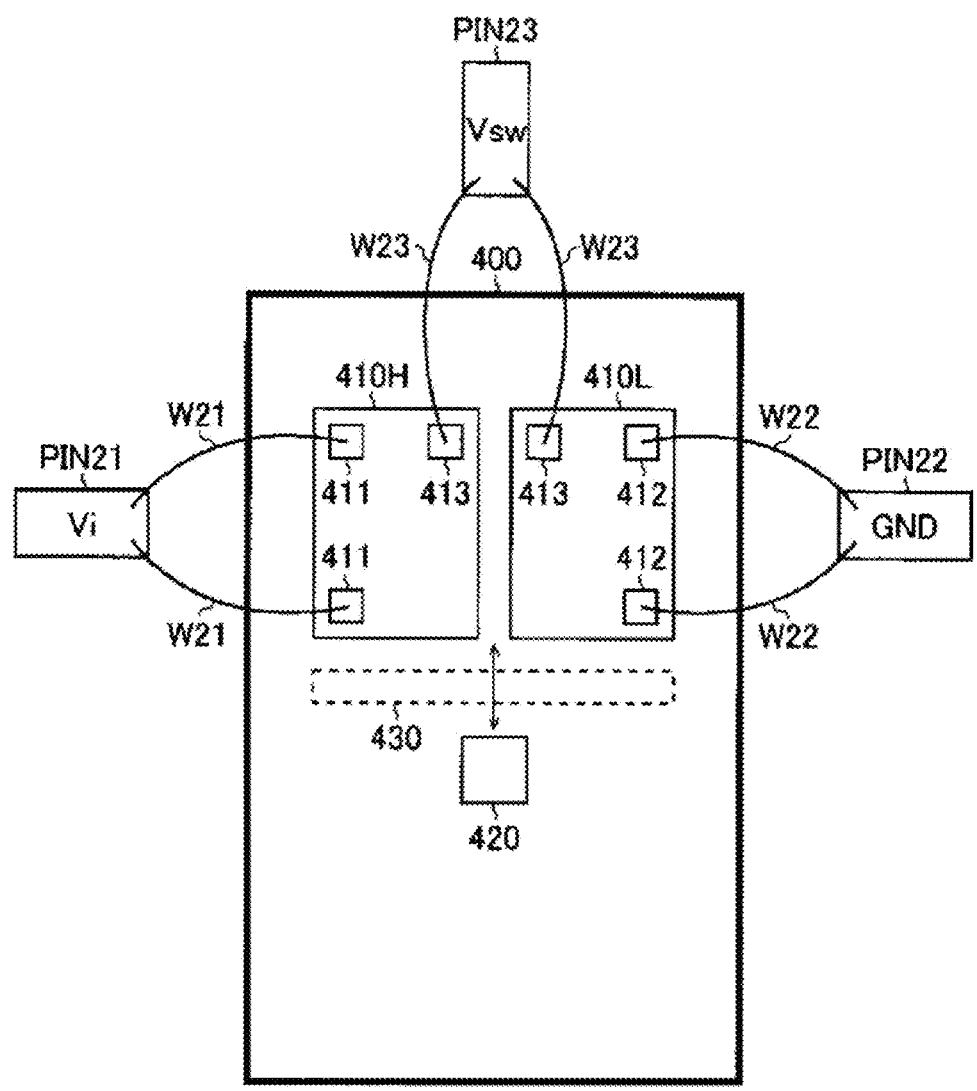

US 9,875,950 B2

SEMICONDUCTOR DEVICE

CROSS-REFERENCE TO RELATED APPLICATION

This application is based upon and claims the benefit of priority from Japanese Patent Application No. 2014-041434, filed on Mar. 4, 2014, the entire contents of which are incorporated herein by reference.

TECHNICAL FIELD

The present disclosure relates to a semiconductor device including an overheat protection circuit.

BACKGROUND

FIG. 10 is a plan view showing a first conventional example of a semiconductor device. A semiconductor device 300 of the first conventional example is an LDO (Low Drop-Out) regulator IC which generates a desired output voltage Vo from an input voltage Vi by controlling conductivity of a power transistor 310 connected between an input terminal PIN11 and an output terminal PIN12. Further, the input terminal PIN11 and a pad 311 are bonded to each other through a wire W11 and the output terminal PIN12 and a pad 312 are bonded to each other through a wire W12.

FIG. 11 is a plan view showing a second conventional example of a semiconductor device. A semiconductor device 400 of the second conventional example is a switching regulator IC which outputs a rectangular waveform of switch voltage Vsw from a switch terminal PIN23 by turning on/off an upper power transistor 410H and a lower power transistor 410L connected in series between an input terminal PIN21 and a ground terminal PIN22. Further, the input terminal PIN21 and a pad 411 are bonded to each other through a wire W21, the ground terminal PIN22 and a pad 412 are bonded to each other through a wire W22, and the switch terminal PIN23 and a pad 413 are bonded to each other through a wire W23.

The power transistor 310 acts as a heat source when the semiconductor device 300 is operated, and the upper power transistor 410H and the lower power transistor 410L act as heat sources when the semiconductor device 400 is operated. On that account, the semiconductor devices 300 and 400 incorporate overheat protection circuits 320 and 420, respectively, which perform a protective operation when a junction temperature exceeds a threshold temperature.

In a conventional semiconductor device, sensitivity and accuracy of the overheat protection circuit were improved by reducing a distance between the heat source and the overheat protection circuit.

As shown in FIG. 10, however, if the size of the power transistor 310 acting as the heat source is large, there occurs an unavoidable temperature gradient between a portion HS which is the hottest portion within the power transistor 310 and an edge of the power transistor 310. This might make it impossible to perform correct heat detection even when the distance between the power transistor 310 and the overheat protection circuit 320 is somewhat reduced.

In addition, as shown in FIG. 11, when the upper power transistor 410H and the lower power transistor 410L acting as the heat sources are turned on/off, in order to prevent the overheat protection circuit 420 from malfunctioning due to switching noise, there is a need to keep a distance between the upper power transistor 410H and lower power transistor 410L and the overheat protection circuit 420 or provide a buffer zone 430 therebetween, which might result in reduced sensitivity and accuracy of the overheat protection circuit 420.

In addition, the conventional technique described above merely aimed at reducing a delay in a temperature transfer or an offset of a temperature detection value between discrete components (ranging from a power element (heat source) to a temperature sensor (heat detection part)) mounted on a circuit board (printed wiring board), rather than improving the sensitivity and accuracy of the overheat protection circuit integrated on the semiconductor device.

SUMMARY

The present disclosure provides some embodiments of a semiconductor device with improved sensitivity and accuracy and high safety of an overheat protection circuit integrated on the semiconductor device.

According to one aspect of the present disclosure, there is provided a semiconductor device including: a heat source and a heat detection element which are formed on a semiconductor substrate; and a heat conductive member formed across both of the heat source and the heat detection element, a thermal conductivity of the heat conductive member being higher than a thermal conductivity of the semiconductor substrate, and wherein the heat source, the heat detection element and the heat conductive member are integrated on the semiconductor substrate.

In some embodiments of the present disclosure, the heat conductive member may be formed by leading a portion of a wiring pattern, which is electrically connected to the heat source, to the heat detection element.

In some embodiments of the present disclosure, the wiring pattern used as the heat conductive member may be a wiring pattern having the least noise superposition, among a plurality of wiring patterns electrically connected to the heat source.

In some embodiments of the present disclosure, the wiring pattern used as the heat conductive member may not be electrically connected to the heat detection element.

In some embodiments of the present disclosure, the heat conductive member may be formed using a dummy wiring pattern which is electrically connected to neither the heat source nor the heat detection element.

In some embodiments of the present disclosure, the heat conductive member may be connected to a ground terminal.

In some embodiments of the present disclosure, the heat conductive member may be formed using at least one of a plurality of wiring layers stacked on the semiconductor substrate.

In some embodiments of the present disclosure, the heat conductive member may be formed using a wiring layer having the highest thermal conductivity, among a plurality of wiring layers stacked on the semiconductor substrate.

In some embodiments of the present disclosure, the heat source may be a power transistor.

According to another aspect of the present disclosure, there is provided an electronic apparatus including the above-described semiconductor device.

BRIEF DESCRIPTION OF THE DRAWINGS

FIG. 11 is a plan view showing a second conventional example of the semiconductor device.

DETAILED DESCRIPTION

First Embodiment

Figure 1A:
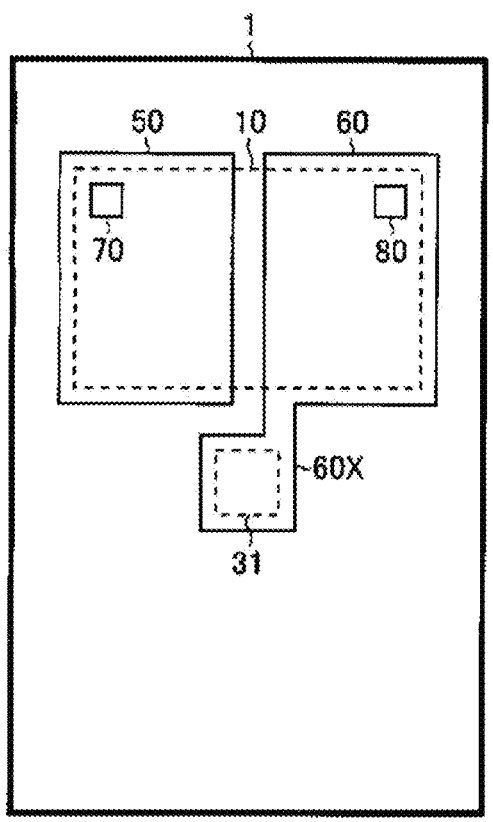
FIGS. 1A and 1B are schematic views showing a first embodiment of a semiconductor device.
Figure 1B:
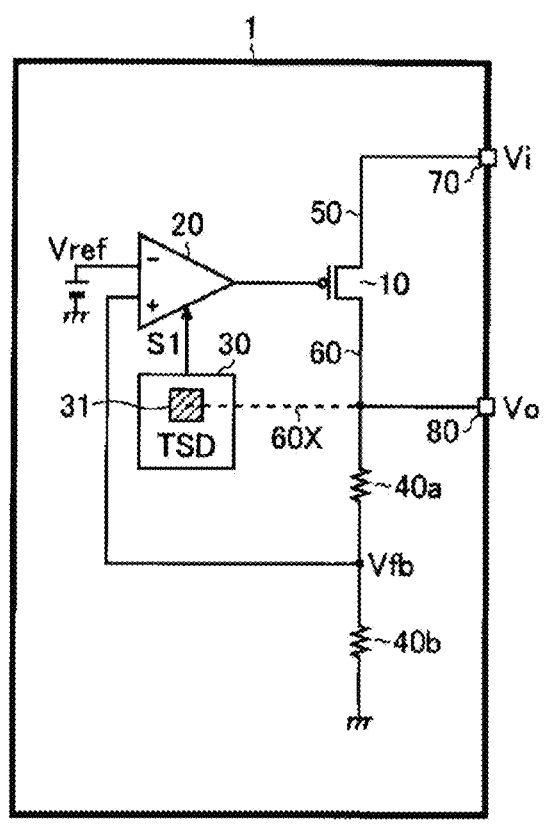

FIGS. 1A and 1B are schematic views showing a first embodiment (application to an LDO regulator IC) of a semiconductor device. FIG. 1A is a plan view (top view) of a semiconductor device 1 and FIG. 1B is a block diagram of the semiconductor device 1.

The semiconductor device 1 of the first embodiment includes a P channel type MOS (Metal Oxide Semiconductor) field effect transistor 10, an OP amplifier 20, an overheat protection circuit 30, resistors 40a and 40b, wiring patterns 50 and 60, and pads 70 and 80.

The transistor 10 is a power transistor integrated on a semiconductor substrate and is connected between the pad 70 (an input terminal of an input voltage Vi) and the pad 80 (an output terminal of an output voltage Vo). In more detail, a source of the transistor 10 is connected to the pad 70 via the wiring pattern 50, a drain of the transistor 10 is connected to the pad 80 via the wiring pattern 60, and a gate of the transistor 10 is connected to an output terminal of the OP amplifier 20.

The OP amplifier 20 generates a gate voltage of the transistor 10 such that a feedback voltage Vfb (a voltage obtained by dividing the output voltage Vo) applied to a non-inverting input terminal (+) is equal to a reference voltage Vref applied to an inverting input terminal (−) (imaginary short). The output feedback control can generate the desired output voltage Vo from the input voltage Vin.

The overheat protection circuit 30 includes a heat detection element 31 integrated on the semiconductor substrate and monitors whether or not a junction temperature Tj exceeds a predetermined threshold temperature Tjmax (for example, 150 degrees C. or 175 degrees C.). Based on this monitoring, the overheat protection circuit 30 generates an overheat protection signal S1. When the overheat protection signal S1 is at a logic level (for example, low level) for overheat detection, the OP amplifier 20 pulls up the gate voltage of the transistor 10 to turn off the transistor 10 by force, without depending on the feedback voltage Vfb. This overheat protection operation can improve safety of the semiconductor device 1.

The resistors 40a and 40b are connected between the pad 80 (the output terminal of the output voltage Vo) and a ground terminal and form a resistor voltage divider which outputs the feedback voltage Vfb from a connection node therebetween.

The wiring pattern 50 is a conductive member (input line) electrically connecting the source of the transistor 10 and the pad 70. The wiring pattern 60 is a conductive member (output line) electrically connecting the drain of the transistor 10 and the pad 80. The wiring patterns 50 and 60 are formed by patterning metal having high conductivity (such as aluminum, copper, silver, gold or the like).

The pad 70 is a metal electrode corresponding to the input terminal of the input voltage Vi and is wire-bonded to an input terminal (not shown). The pad 80 is a metal electrode corresponding to the output terminal of the output voltage Vo and is wire-bonded to an output terminal (not shown).

Here, in the semiconductor device 1 of the first embodiment, the sensitivity and accuracy of the overheat protection circuit 30 are improved by going through studies on a wiring layout pattern on a semiconductor substrate, instead of the circuit configuration of the overheat protection circuit 30. In more detail, in the semiconductor device 1 of the first embodiment, a heat conductive member 60X is formed to overlap with the heat detection element 31 by leading a portion of the wiring pattern 60, which is electrically connected to the drain of the transistor 10 acting as a heat source, to the heat detection element 31. It is not necessary for the heat conductive member 60X to make electrical connection with the heat detection element 31.

Conventionally, heat conduction through a wiring pattern has not been of a particular interest. In most cases, heat was conveyed from a heat source to a heat detection part via a semiconductor substrate made of silicon (its thermal conductivity λ=115 [W/m·K] at 100 degrees C.).

On the contrary, in the semiconductor device 1 of the first embodiment, heat is conveyed from the transistor 10 to the heat detection element 31 via the wiring pattern 60 and the heat conductive member 60X made of aluminum (λ=232 [W/m·K] at 100 degrees C.) having higher thermal conductivity than that of silicon, which means faster heat conveyance than a conventional one. In addition, since thermal conductivity of metal, including aluminum, generally has positive temperature dependency, the thermal conductivity of aluminum is two to four times as large as that of silicon around the threshold temperature Tjmax (150 degrees C. or 175 degrees C.) of the overheat protection circuit 30. Therefore, in the overheat protection circuit 30, since heat emitted from the transistor 10 can be detected correctly and quickly, the sensitivity and accuracy of the overheat protection circuit 30 can be improved.

In addition, in the semiconductor device 1 of the first embodiment, the heat conductive member 60X is formed by using a portion of the wiring pattern 60 electrically connected to the transistor 10. With this configuration, the heat conductive member 60X can be formed substantially without altering the existing design of the wiring patterns 50 and 60.

In the specification, for convenience of description, although the portion of the wiring pattern 60 (an extension led to the heat detection element 31) is referred to as the heat conductive member 60X, the wiring pattern 60 and the heat conductive member 60X are just integrally formed as a single member, and the heat emitted from the transistor 10 arrives at the heat detection element 31 via both of the wiring pattern 60 and the heat conductive member 60X. It is, therefore, understood that not only the heat conductive member 60X but also the wiring pattern 60 integrated with the heat conductive member 60X can act as a heat conductive member.

In addition, in the semiconductor device 1 of the first embodiment, the wiring patterns 50 and 60 electrically connected to the transistor 10, and a portion of the wiring pattern 60 having less noise superposition is used to form the heat conductive member 60X. This configuration can reduce malfunction of the overheat protection circuit 30 due to the noise. Further, if there is no significant difference in the amount of the noise superposition between the wiring patterns 50 and 60, either one of the two wiring patterns 50 and 60 may be used to form the heat conductive member.

In addition, the material of the heat conductive member 60X (further the wiring pattern 60) is not limited to aluminum ($\lambda$=232 [W/m·K] at 100 degrees C.) which is first exemplified, but may be other metal being higher in the thermal conductivity than aluminum (for example, copper ($\lambda$=395 [W/m·K] at 100 degrees C.), silver ($\lambda$=422 [W/m·K] at 100 degrees C.), gold ($\lambda$=313 [W/m·K] at 100 degrees C.) or the like).

<Overheat Protection Circuit>

Figure 2:
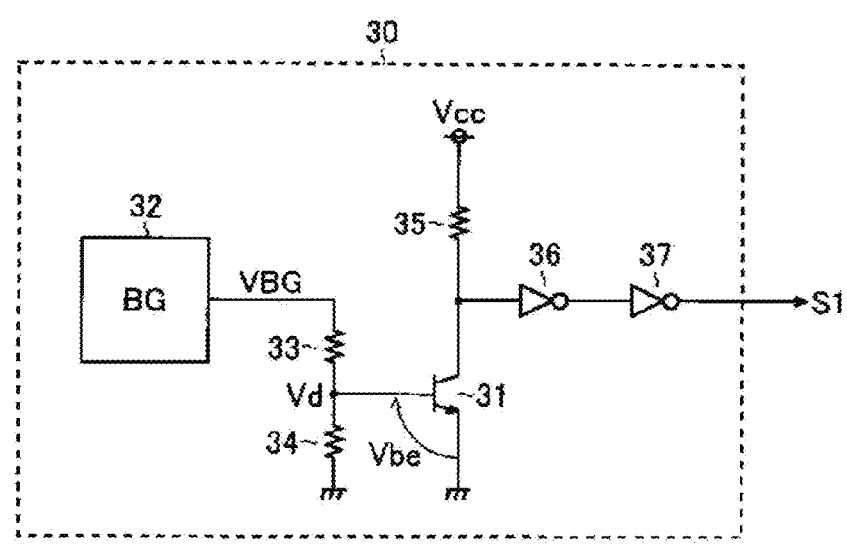
FIG. 2 is a circuit diagram showing one configuration example of an overheat protection circuit 30.

FIG. 2 is a circuit diagram showing one configuration example of the overheat protection circuit 30. The overheat protection circuit 30 of this configuration example includes an npn type bipolar transistor 31 (this corresponds to the above-described heat detection element 31. Therefore, in the following description, this will be denoted by the same reference numeral), a bandgap power supply 32, resistors 33 to 35, and inverters 36 and 37.

The bandgap power supply 32 generates a bandgap voltage VBG which is constant without depending on a power supply voltage Vcc or an ambient temperature. The resistors 33 and 34 are connected in series between an application terminal of the bandgap voltage VBG and a ground terminal and form a resistor voltage divider which outputs a division voltage Vd from a connection node therebetween.

A base of the transistor 31 is connected to an application terminal of the division voltage Vd. An emitter of the transistor 31 is connected to the ground terminal A collector of the transistor 31 is connected to a first terminal of the resistor 35 and an input terminal of the inverter 36. A second terminal of the resistor 35 is connected to an application terminal of the power supply voltage Vcc. An output terminal of the inverter 36 is connected to an input terminal of the inverter 37. An output terminal of the inverter 37 corresponds to an output terminal of the overheat protection signal S1.

In the overheat protection circuit 30 of this configuration example, a logic level of the overheat protection signal S1 is switched based on the fact that a base-emitter voltage Vbe of the transistor 31 (corresponding to a forward voltage drop Vf of a diode) has a negative temperature characteristic, as will be described in more detail below.

A higher junction temperature Tj of the semiconductor device 1 provides a lower base-emitter voltage Vbe of the transistor 10. Accordingly, with an increase in the junction temperature Tj of the semiconductor device 1, a collector current flowing in the transistor 10 increases, a voltage drop in the resistor 35 increases, and a collector voltage of the transistor 10 (an input terminal voltage of the inverter 36) decreases.

Here, the overheat protection circuit 30 is designed in such a manner that the collector voltage of the transistor 31 exceeds a threshold voltage of the inverter 36 when the junction temperature Tj of the semiconductor device 1 is lower than the threshold temperature Tjmax. Accordingly, when no overheat is detected (Tj<Tjmax), the overheat protection signal S1 is at a high level.

On the other hand, when the junction temperature Tj of the semiconductor device 1 exceeds the threshold temperature Tjmax and the collector voltage of the transistor 31 is lower than the threshold voltage of the inverter 36, output logic levels of the inverters 36 and 37 are switched. Accordingly, when overheat is detected (Tj≥Tjmax), the overheat protection signal S1 is switched from the high level to a low level.

In this manner, when the transistor 31 is used as a heat detection element, the above-described heat conductive member 60X may be formed to overlap with the transistor 31.

<Vertical Structure>

Figure 3A:
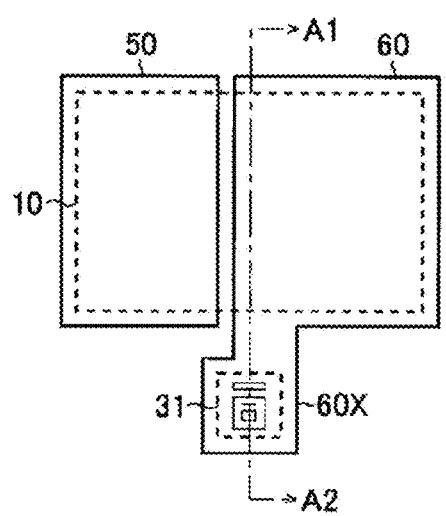
FIG. 3A is a plan view and FIG. 3B is a longitudinal sectional view showing a first example (two-layer type) of a wiring pattern.
Figure 3B:
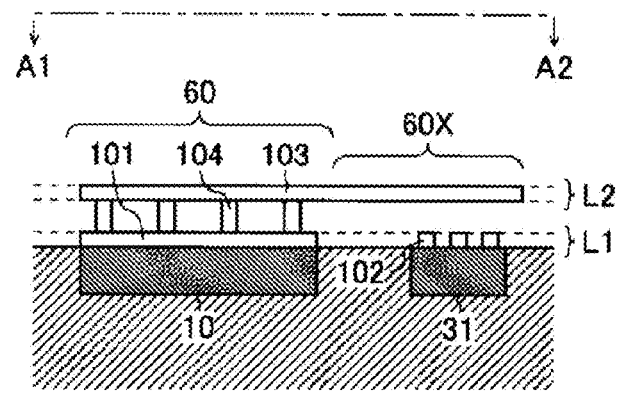

FIGS. 3A and 3B are schematic views showing a first example (two-layer type) of a wiring pattern. FIG. 3A is a plan view (top view) of the semiconductor device 1, and FIG. 3B is an A1-A2 longitudinal sectional view of the semiconductor device 1. In the first example shown in FIGS. 3A and 3B, two wiring layers L1 and L2 are stacked on a semiconductor substrate. The first (lower) wiring layer L1 includes a wiring pattern 101 electrically connected to a transistor 10 (heat source) and a wiring pattern 102 electrically connected to a transistor 31 (heat detection element). The second (upper) wiring layer L2 includes a wiring pattern 103 formed across both of the transistor 10 (heat source) and the transistor 31 (heat detection element). The wiring pattern 101 and the wiring patterns 103 are electrically interconnected through vias 104. The wiring pattern 102 and the wiring pattern 103 are not electrically interconnected.

When paying attention to the wiring pattern 103 of the wiring layer L2, a portion overlapping with the transistor 10 corresponds to the above-described wiring pattern 60, and an extension led from an edge of the transistor 10 to the transistor 31 corresponds to the above-described heat conductive member 60X. In this manner, at least one of the wiring layers L1 and L2 stacked on the semiconductor substrate may be used to form the heat conductive member 60X.

Figure 4A:
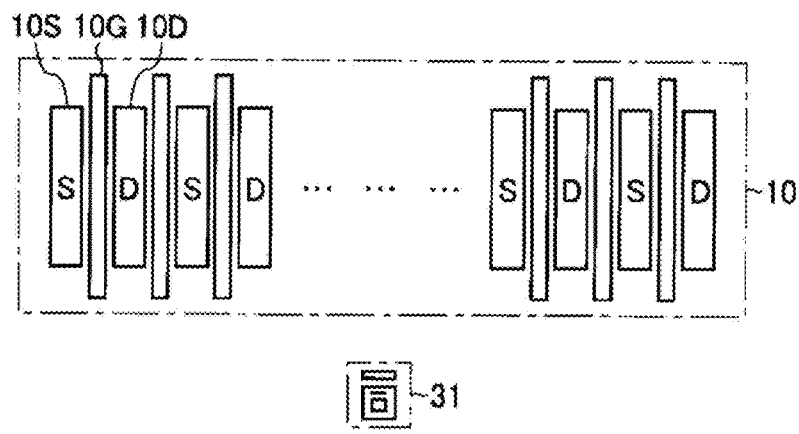
FIGS. 4A to 4D are plan views showing a second example (three-layer type) of the wiring pattern.

FIGS. 4A to 4D are plan views showing a second example (three-layer type) of a wiring pattern. FIG. 4A shows transistors 10 and 31 formed on a semiconductor substrate. The transistor 10 is formed by connecting a plurality of unit transistors, each of which includes a source region 10S, a drain region 10D, and a gate insulating film 10G, in parallel.

Figure 4B:
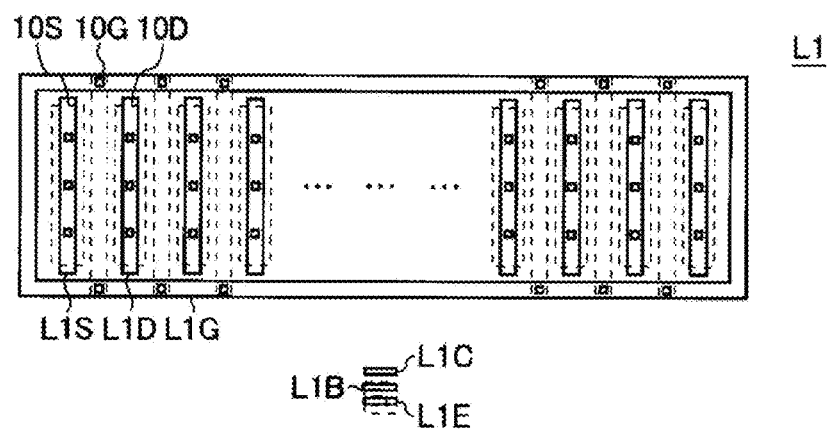

FIG. 4B shows the first (lower) wiring layer L1 formed on the transistors 10 and 31. A source wiring pattern L1S is formed on the source region 10S in contact with the source region 10S. A drain wiring pattern L1D is formed on the drain region 10D in contact with the drain region 10D. A gate wiring pattern L1G is annularly formed in the peripheral portion of the transistor 10 in contact with the gate insulating film 10G. A collector wiring pattern L1C, an emitter wiring pattern L1E, and a base wiring pattern L1B are formed on the transistor 31.

Figure 4C:
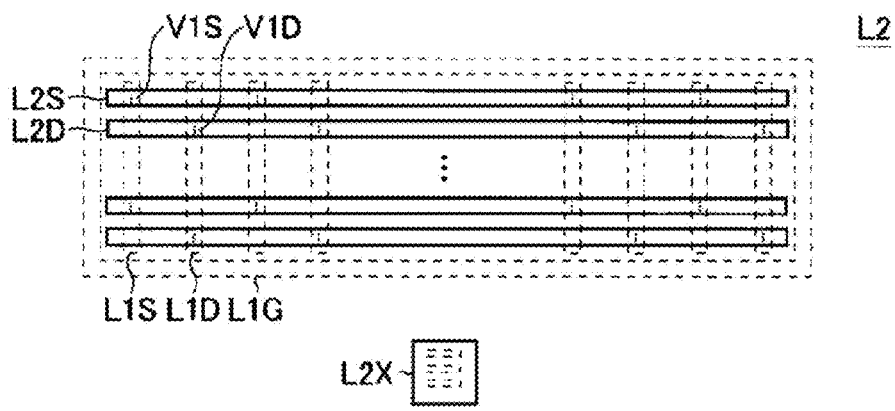

FIG. 4C shows the second (middle) wiring layer L2 formed on the wiring layer L1. A source wiring pattern L2S and a drain wiring pattern L2D are formed in the wiring layer L2. The source wiring pattern L1S/drain wiring pattern L1D and the source wiring pattern L2S/drain wiring pattern L2D are respectively perpendicular to each other in their extension direction. Between the source wiring pattern L1S and the source wiring pattern L2S is formed a via V1S which electrically connects overlapping portions of these patterns L1S and L2S. Between the drain wiring pattern L1D and the drain wiring pattern L2D is formed a via V1D which electrically connects overlapping portions of these patterns L1D and L2D. A heat conductive member L2X is formed on the collector wiring pattern L1C, the emitter wiring pattern L1E, and the base wiring pattern L1B. However, no electrical connection is made between each of the wiring patterns L1C, L1E and L1B and the heat conductive member L2X.

Figure 4D:
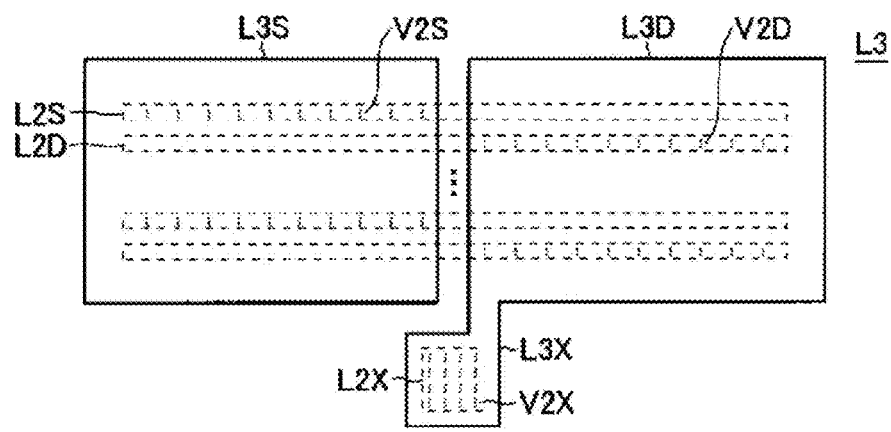

FIG. 4D shows the third (upper) wiring layer L3 formed on the wiring layer L2. A source wiring pattern L3S and a drain wiring pattern L3D are formed in the wiring layer L3. The source wiring pattern L3S is formed to cover one half of the semiconductor device 1 and is electrically connected to the source wiring pattern L2S through a via V2S. The drain wiring pattern L3D is formed to cover the other half of the semiconductor device 1 and is electrically connected to the drain wiring pattern L2D through a via V2D. As a heat conductive member L3X, a portion of the drain wiring pattern L3D is led to a region overlapping with the heat conductive member L2X. Between the heat conductive member L3X and the heat conductive member L2X is formed a via V2X connecting these members L3X and L2X.

Figure 5:
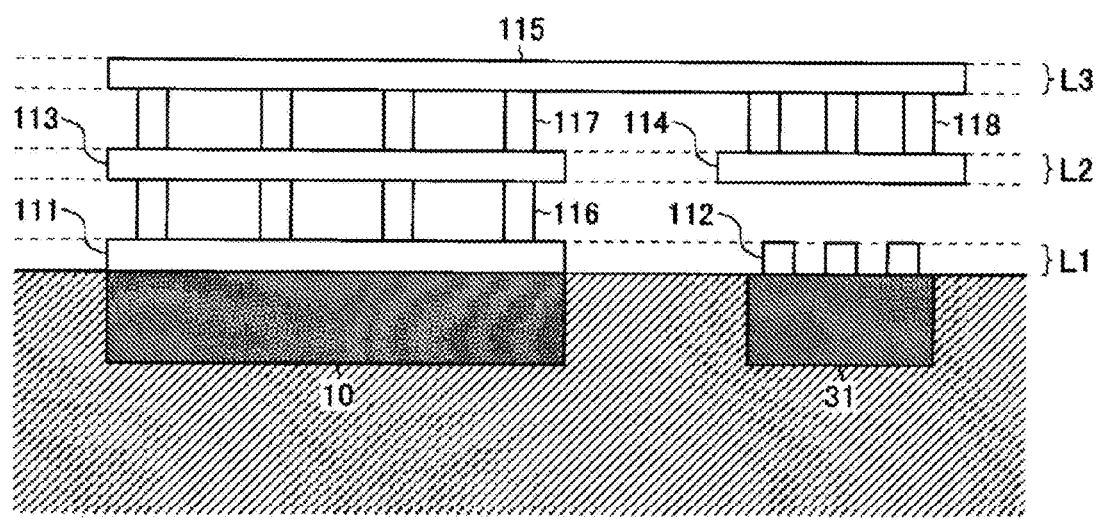
FIG. 5 is a longitudinal sectional view showing the second example (three-layer type) of the wiring pattern.

FIG. 5 is a longitudinal sectional view showing the second example (three-layer type) of the wiring pattern and corresponds to a longitudinal sectional view of the wiring pattern shown in FIGS. 4A to 4D. In the second example of FIG. 5, three wiring layers L1 to L3 are stacked on a semiconductor substrate. The first (lower) wiring layer L1 includes a wiring pattern 111 electrically connected to a transistor 10 (heat source) and a wiring pattern 112 electrically connected to a transistor 31 (heat detection element). The second (middle) wring layer L2 includes a wiring pattern 113 formed on the wiring pattern 111, and a wiring pattern 114 formed on the wiring pattern 112. The third (upper) wiring layer L3 includes a wiring pattern 115 formed across both of the transistor 10 (heat source) and the transistor 31 (heat detection element). The wiring pattern 111 and the wiring patterns 113, the wiring pattern 113 and the wiring patterns 115, and the wiring pattern 114 and the wiring patterns 115 are respectively electrically interconnected through vias 116 to 118, respectively. The wiring pattern 112 and the wiring pattern 114 are not electrically interconnected.

When paying attention to the wiring pattern 115 of the wiring layer L3, a portion overlapping with the transistor 10 corresponds to the above-described drain wiring pattern L3D, and an extension led from an edge of the transistor 10 to the top of the transistor 31 corresponds to the above-described heat conductive member L3X (see FIG. 4D). The wiring pattern 114 of the wiring layer L2 corresponds to the above-described heat conductive member L2X (see FIG. 4C). In this manner, in the semiconductor device including three (or more) wiring layers, since a vertical distance between the uppermost wiring layer and the heat detection element is large, a middle or lower wiring layer may be used to stack the heat conductive members in the vertical direction.

If a plurality of wiring layers is made of different materials, respectively, a wiring layer having the highest thermal conductivity may be used to form the heat conductive member. For example, if the wiring layer L1 is made of aluminum and the wiring layers L2 and L3 are made of copper, the wiring layers L2 and L3 having higher thermal conductivity may be used to form the heat conductive members L2X and L3X. In other words, the wiring layer used for the heat conductive member may be made of a material having higher thermal conductivity than other wiring layers.

Figure 6A:
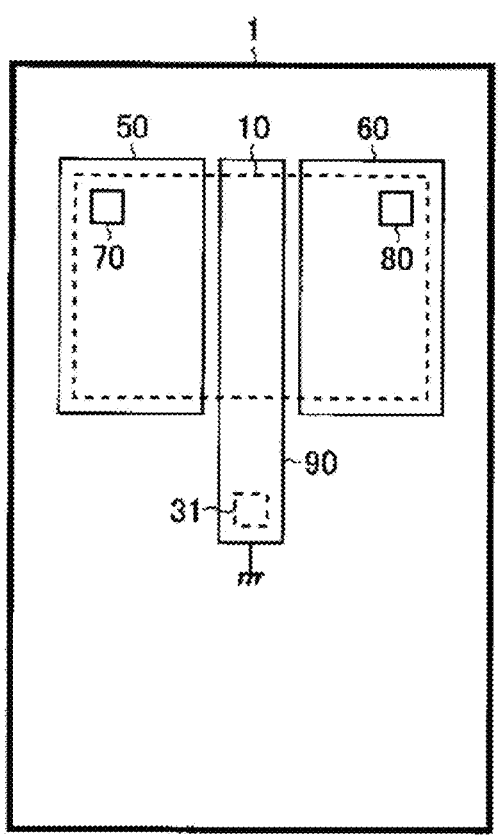
FIGS. 6A and 6B are plan views showing one modification of the first embodiment.
Figure 6B:
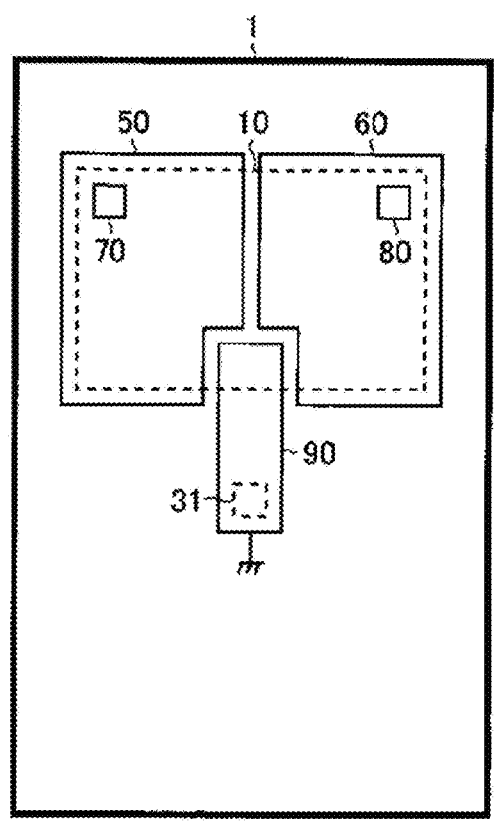

FIGS. 6A and 6B are plan views showing one modification of the first embodiment. A heat conductive member 90 shown in FIG. 6A is formed using a dummy wiring pattern which is electrically connected to neither the transistor 10 nor the heat detection element 31, rather than using the wiring pattern 60 electrically connected to the transistor 10.

This configuration allows the wiring pattern 60 and the heat conductive member 90 to be connected to different potential points, respectively. For example, as shown in FIG. 6A, when the heat conductive member 90 is connected to a ground terminal, a noise received by the heat conductive member 90 can be quickly released to the ground terminal, thereby reducing malfunction of the overheat protection circuit 30 due to the noise.

In addition, as shown in FIG. 6B, the heat conductive member 90 may overlap with at least a portion of the transistor 10 acting as a heat source. This configuration allows the heat conductive member 90 to be formed with potential-independency from the wiring patterns 50 and 60, without unnecessarily reducing the size of the wiring patterns 50 and 60.

Second Embodiment

Figure 7A:
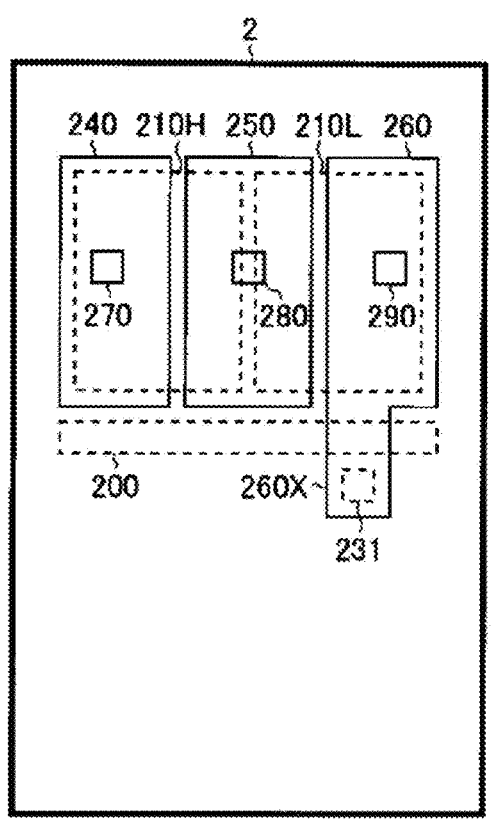
FIGS. 7A and 7B are schematic views showing a second embodiment of the semiconductor device.
Figure 7B:
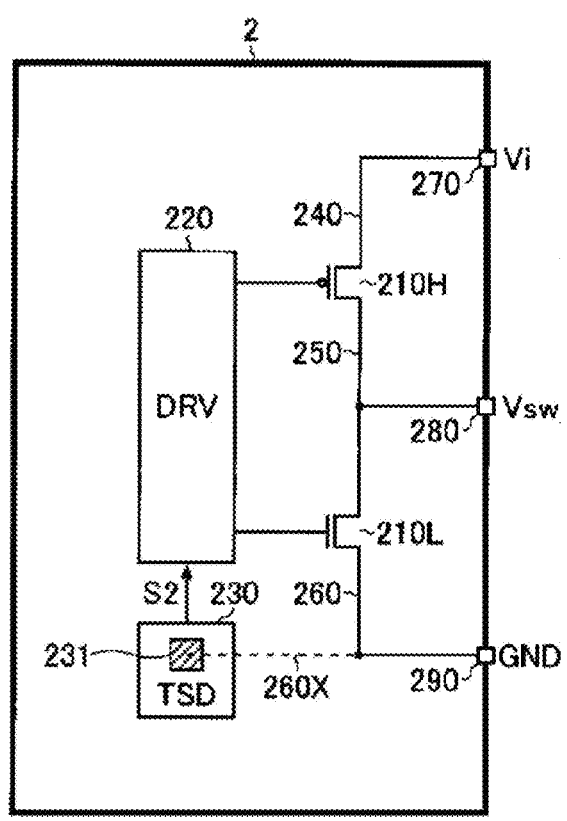

FIGS. 7A and 7B are schematic views showing a second embodiment (application to a switching regulator IC) of the semiconductor device. FIG. 7A is a plan view (top view) of the semiconductor device 2 and FIG. 7B is a block diagram of the semiconductor device 2.

The semiconductor device 2 of the second embodiment includes a P channel type MOS field effect transistor 210H, an N channel type MOS field effect transistor 210L, a driver 220, an overheat protection circuit 230, wiring patterns 240 to 260, and pads 270 to 290.

The transistor 210H is an upper power transistor integrated on a semiconductor substrate and is connected between the pad 270 (an input terminal of an input voltage Vi) and the pad 280 (an output terminal of a switch voltage Vsw). In more detail, a source of the transistor 210H is connected to the pad 270 via the wiring pattern 240, a drain of the transistor 210H is connected to the pad 280 via the wiring pattern 250, and a gate of the transistor 210H is connected to a first output terminal of the driver 220.

The transistor 210L is a lower power transistor integrated on the semiconductor substrate and is connected between the pad 280 and the pad 290 (a ground terminal). In more detail, a drain of the transistor 210L is connected to the pad 280 via the wiring pattern 250, a source of the transistor 210L is connected to the pad 290 via the wiring pattern 260, and a gate of the transistor 210L is connected to a second output terminal of the driver 220.

The driver 220 generates gate voltages of the transistors 210H and 210L such that the transistors 210H and 210L are complementarily turned on/off, respectively. As used herein, the term "complementarily" includes not only a case where the on/off state of the transistors 210H and 210L is completely reversed, but also a case where a concurrent off period of the transistors 210H and 210L is provided in order to prevent through-current. This on/off control can generate a rectangular waveform of switch voltage Vsw pulse-driven between the input voltage Vi and a ground voltage GND. In addition, in the outside of the semiconductor device 2, a desired output voltage Vo can be generated by smoothing the switch voltage Vsw.

The overheat protection circuit 230 includes a heat detection element 231 integrated with the semiconductor substrate and monitors whether or not a junction temperature Tj exceeds a predetermined threshold temperature Tjmax (for example, 150 degrees C. or 175 degrees C.). Based on this monitoring, the overheat protection circuit 230 generates an overheat protection signal S2. When the overheat protection signal S2 is at a logic level (for example, low level) for overheat detection, the driver 220 turns off the transistors 210H and 210L by force. This overheat protection operation can contribute to high safety of the semiconductor device 2.

The semiconductor device 2 of the second embodiment tends to produce a switching noise due to the turning-on/off of the transistors 210H and 210L. Therefore, as a measure against malfunction of the overheat protection circuit 230 due to the switching noise, a buffer zone 200 may be provided between the overheat protection circuit 230 and the transistors 210H and 210L.

The wiring pattern 240 is a conductive member (input line) electrically connecting the source of the transistor 210H and the pad 270. The wiring pattern 250 is a conductive member (output line) electrically connecting the drains of the transistors 210H and 210L and the pad 280. The wiring pattern 260 is a conductive member (ground line) electrically connecting the source of the transistor 210L and the pad 290. The wiring patterns 240 to 260 are formed by patterning metal having high conductivity (such as aluminum, copper, silver, gold or the like).

The pad 270 is a metal electrode corresponding to the input terminal of the input voltage Vi and is wire-bonded to an input terminal (not shown). The pad 280 is a metal electrode corresponding to the output terminal of the switch voltage Vsw and is wire-bonded to a switch terminal (not shown). The pad 290 is a metal electrode corresponding to an application terminal of the ground voltage GND and is wire-bonded to a ground terminal (not shown).

Even in the semiconductor device 2 of the second embodiment, like the above-described first embodiment, the sensitivity and accuracy of the overheat protection circuit 230 are improved by going through studies on a wiring layout pattern on a semiconductor substrate, instead of the circuit configuration of the overheat protection circuit 230. In more detail, in the semiconductor device 2 of the second embodiment, a heat conductive member 260X is formed to overlap with the heat detection element 231 by leading a portion of the wiring pattern 260, which is electrically connected to the source of the transistor 210L acting as a heat source, to the heat detection element 231.

This configuration allows the overheat protection circuit 230 to detect heat generated in the transistor 10 accurately and quickly, which can result in improved sensitivity and accuracy of the overheat protection circuit 230.

In addition, in the semiconductor device 2 of the second embodiment, the wiring patterns 240 to 260 electrically connected to the transistors 210H and 210L, and a portion of the wiring pattern 260 (ground line) having the least noise superposition is used to form the heat conductive member 260X. This configuration can reduce malfunction of the overheat protection circuit 230 due to noises. In particular, since a switching noise is likely to be superimposed on the wiring pattern 250 to which the rectangular waveform of switch voltage Vsw is applied, it is advantageous to avoid using the wiring pattern 250 as a heat conductive member.

<Applications to Electronic Apparatuses>

Figure 8:
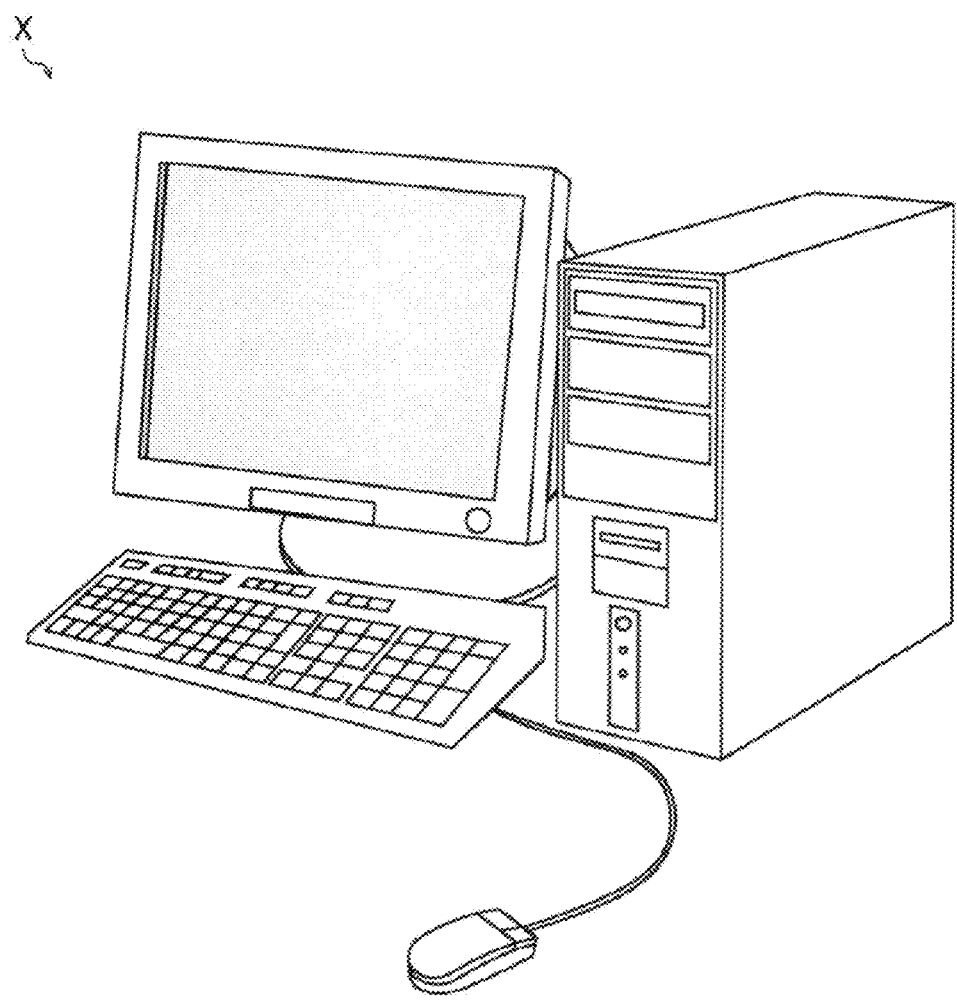
FIG. 8 shows an external appearance of a personal computer.
Figure 9:
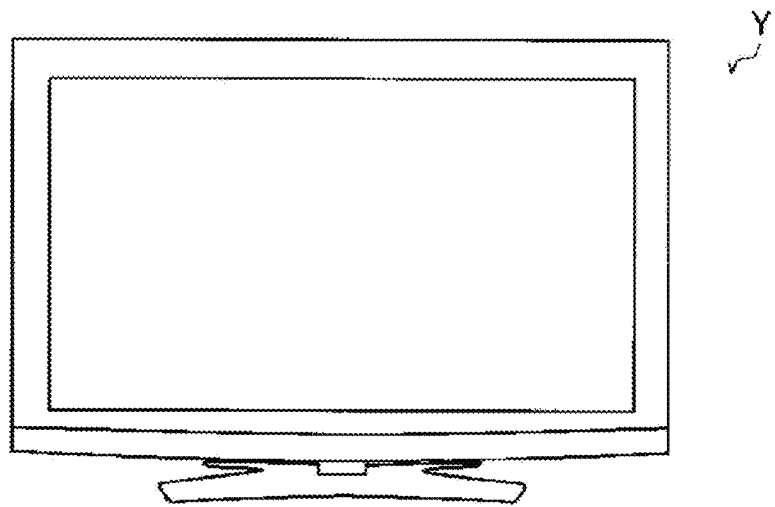
FIG. 9 shows an external appearance of a television.
Figure 10:
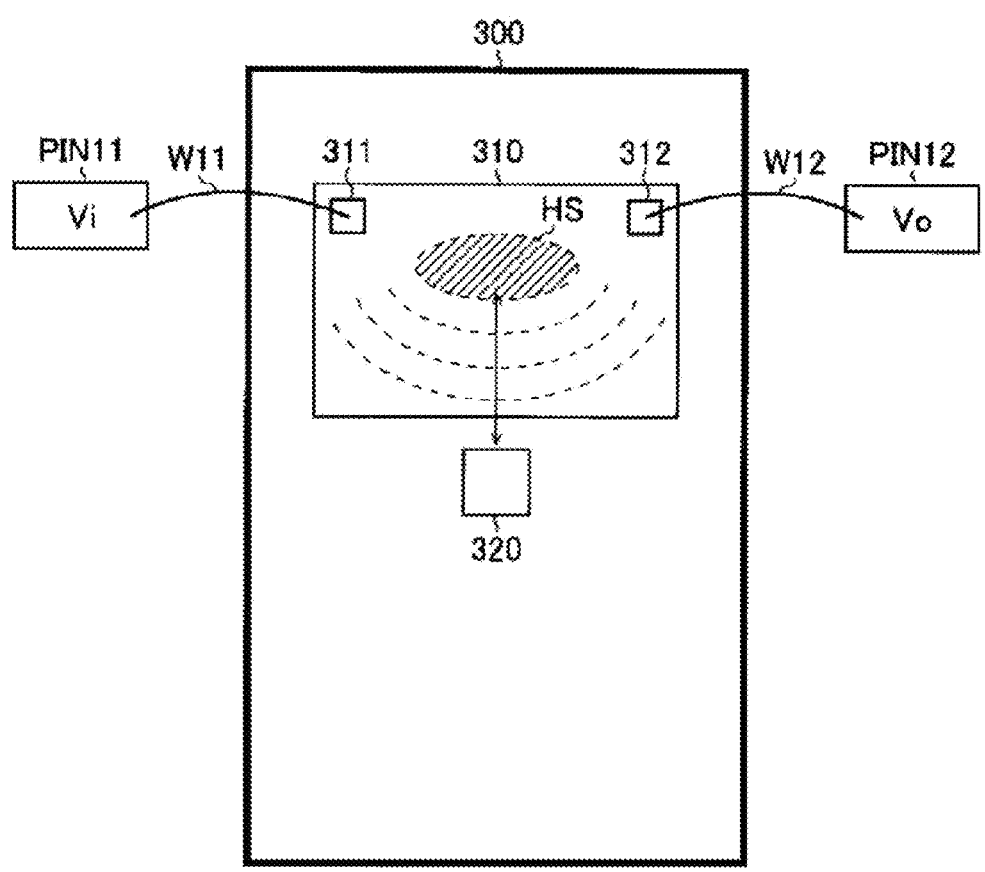
FIG. 10 is a plan view showing a first conventional example of a semiconductor device.

FIG. 8 shows an external appearance of a personal computer X, and FIG. 9 shows an external appearance of a television Y. The use of the above-described semiconductor devices 1 and 2 as power supply ICs of these electronic apparatuses can result in increased safety and reliability of the electronic apparatuses.

OTHER MODIFICATIONS

The present disclosure is not limited to the above but may be applied to a wide range of semiconductor devices (including, for example, power devices such as a power supply IC, a power supply driver IC, a power management IC, a load switch IC, a motor driver IC, and a reset IC and so on) provided with an overheat protection circuit.

According to some embodiments of the present disclosure, it is possible to improve sensitivity and accuracy of an overheat protection circuit integrated on the semiconductor device, thus improving safety of the semiconductor device.

The present disclosure can be used to provide high safety and reliability of semiconductor devices.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
   a semiconductor substrate;
   a switching element on the semiconductor substrate, the switching element producing heat and a switching noise;
   a wiring pattern over the semiconductor substrate, and electrically connected to the switching element;
   a pad over the wiring pattern, as a voltage terminal, and connected to the switching element via the wiring pattern;
   a heat detection element on the semiconductor substrate, which is below the wiring pattern, the heat detection element being spaced apart from the switching element with a buffer zone therebetween to reduce the switching noise produced and transmitted from the switching element to the heat detection element; and
   a heat conductive member, which is a part of the wiring pattern disposed between the pad and the semiconductor substrate, the heat conductive member being disposed across from the switching element and the heat detection element to convey the heat from the switching element to the heat detection element on the semiconductor substrate apart from the switching element with the buffer zone therebetween to reduce the switching noise transmitted from the switching element, a thermal conductivity of the heat conductive member being higher than a thermal conductivity of the semiconductor substrate,
   wherein the switching element, the heat detection element and the heat conductive member are integrated on the semiconductor substrate.

2. The semiconductor device of claim 1, wherein the heat conductive member is electrically connected to the switching element.

3. The semiconductor device of claim 2, wherein the part of the wiring pattern used as the heat conductive member is not electrically connected to the heat detection element.

4. The semiconductor device of claim 1, wherein the part of the wiring pattern used as the heat conductive member is a wiring pattern having the least noise superposition, among a plurality of wiring patterns electrically connected to the switching element.

5. The semiconductor device of claim 4, wherein the heat conductive member is connected to a ground terminal.

6. The semiconductor device of claim 1, wherein the heat conductive member is formed using a dummy wiring pattern which is not electrically connected to the heat detection element.

7. The semiconductor device of claim 1, wherein the heat conductive member is formed using at least one of a plurality of wiring layers which are integrally formed as a single member stacked on the semiconductor substrate.

8. The semiconductor device of claim 7, wherein the plurality of wiring layers includes a low wiring layer and a high wiring layer over the low wiring layer from the semiconductor substrate, and
wherein the heat conductive member is the low wiring layer of the plurality of wiring layers.

9. The semiconductor device of claim 1, wherein the heat conductive member is formed using a wiring layer having the highest thermal conductivity, among a plurality of wiring layers stacked on the semiconductor substrate.

10. The semiconductor device of claim 1, wherein the switching element is a power transistor.

11. An electronic apparatus comprising a semiconductor device of claim 1.

12. The semiconductor device of claim 1, wherein the heat conductive member and the wiring pattern are produced by one process.

13. A semiconductor device comprising:
a semiconductor substrate;
a switching element on the semiconductor substrate, the switching element producing heat;
a wiring pattern over the semiconductor substrate, and electrically connected to the switching element;
a pad over the wiring pattern, as a voltage terminal, and connected to the switching element via the wiring pattern;
a heat detection element on the semiconductor substrate, which is below the wiring pattern; and
a heat conductive member, which is a part of the wiring pattern disposed between the pad and the semiconductor substrate, the heat conductive member being disposed across from the switching element and the heat detection element to convey the heat from the switching element to the heat detection element formed on the semiconductor substrate.

14. The semiconductor device of claim 13, wherein the heat conductive member is formed using a dummy wiring pattern which is not electrically connected to the heat detection element.

15. The semiconductor device of claim 13, wherein the heat conductive member is formed using a wiring layer having the highest thermal conductivity, among a plurality of wiring layers stacked on the semiconductor substrate.

16. The semiconductor device of claim 13, wherein the heat conductive member is formed using at least one of a plurality of wiring layers which are integrally formed as a single member stacked on the semiconductor substrate.

17. The semiconductor device of claim 13, wherein the heat conductive member and the wiring pattern are produced by one process.

18. The semiconductor device of claim 13, wherein the heat conductive member is connected to a ground terminal.

19. The semiconductor device of claim 13, wherein the plurality of wiring layers includes a low wiring layer and a high wiring layer over the low wiring layer from the semiconductor substrate, and
wherein the heat conductive member is the low wiring layer of the plurality of wiring layers.

\* \* \* \* \*